United States Patent
Ludwig et al.

(10) Patent No.: US 11,038,292 B2
(45) Date of Patent: Jun. 15, 2021

(54) PRESS-IN PIN FOR AN ELECTRICAL CONTACTING ASSEMBLY

(71) Applicant: Robert Bosch GmbH, Stuttgart (DE)

(72) Inventors: Ronny Ludwig, Reutlingen (DE); Andreas Hachtel, Leinfelden-Echterdingen (DE); Gustav Klett, Moessingen (DE); Martin Schuerer, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/643,016

(22) PCT Filed: Aug. 3, 2018

(86) PCT No.: PCT/EP2018/071187
§ 371 (c)(1),
(2) Date: Feb. 28, 2020

(87) PCT Pub. No.: WO2019/042708
PCT Pub. Date: Mar. 7, 2019

(65) Prior Publication Data
US 2020/0343655 A1 Oct. 29, 2020

(30) Foreign Application Priority Data
Aug. 28, 2017 (DE) ...................... 10 2017 215 026.2

(51) Int. Cl.
*H01R 12/58* (2011.01)
*H01R 4/02* (2006.01)
*H01R 43/02* (2006.01)

(52) U.S. Cl.
CPC .......... *H01R 12/585* (2013.01); *H01R 4/025* (2013.01); *H01R 43/0221* (2013.01); *H01R 43/0256* (2013.01)

(58) Field of Classification Search
CPC .. H01R 13/03; H01R 12/585; H01R 43/0221; H01R 43/0256; H01R 4/025; H01R 43/0214; C25D 5/12; B23K 20/00
(Continued)

(56) References Cited

U.S. PATENT DOCUMENTS 5,497,546 A * 3/1996 Kubo .................... H01L 21/486
219/85.13
7,090,112 B2 * 8/2006 Masingale ......... B23K 20/1265
228/112.1
(Continued)

FOREIGN PATENT DOCUMENTS

DE 10349584 3/2004
DE 102014117410 6/2016
EP 2811051 12/2014

OTHER PUBLICATIONS

International Search Report for Application No. PCT/EP2018/071187 dated Oct. 16, 2018 (English Translation, 2 pages).

*Primary Examiner* — Renee S Luebke
*Assistant Examiner* — Paul D Baillargeon
(74) *Attorney, Agent, or Firm* — Michael Best & Friedrich LLP

(57) ABSTRACT

The invention relates to a press-in pin (10) for an electrical contacting assembly (1), having an elastic press-in region (12) and an electrically conductive coating (14). The invention further relates to a corresponding contacting assembly (1), and to a method for joining a press-in pin (10) and a metallized via (7). The coating (14) comprises a reactive multi-layer applied to the press-in pin (10) and a first contact layer applied to the reactive multi-layer.

14 Claims, 3 Drawing Sheets

(58) Field of Classification Search
USPC .................................................. 200/238, 239
See application file for complete search history.

(56) References Cited

U.S. PATENT DOCUMENTS

| | | | |
|---|---|---|---|
| 8,101,285 B2 * | 1/2012 | Mitose | C25D 5/50 |
| | | | 428/607 |
| 9,694,441 B2 * | 7/2017 | Syassen | B23K 26/211 |
| 9,728,878 B2 * | 8/2017 | Shibuya | C25D 5/12 |
| 10,551,262 B2 * | 2/2020 | Tham | B81B 3/0021 |
| 10,693,248 B2 * | 6/2020 | Teichmann | H01R 12/52 |
| 2011/0031301 A1 | 2/2011 | Segletes et al. | |
| 2012/0076574 A1 * | 3/2012 | Parkhe | B23K 1/0008 |
| | | | 403/272 |
| 2014/0210110 A1 | 7/2014 | Smith | |

* cited by examiner

PRESS-IN PIN FOR AN ELECTRICAL CONTACTING ASSEMBLY

BACKGROUND OF THE INVENTION

The invention proceeds from a press-in pin for an electrical contact-making arrangement comprising an elastic press-in region and an electrically conductive coating. The present invention also relates to an electrical contact-making arrangement comprising a press-in pin of this kind and also to a method for joining a press-in pin and a metallized plated-through hole.

The prior art discloses printed circuit board press-in pins with a modest number of different coating variants. A distinction is made between tin-based coating variants and tin-free coating variants here. These different layer systems are used depending on the expected loading on the electromechanical connection between the press-in pin and the metallized plated-through hole. The mechanical connection between the press-in pin and the plated-through hole is based on a non-positively locking connection, a positively locking connection and an integrally joined connection. The non-positively locking connection is determined by the spring characteristic of the elastic press-in pin, and therefore by its spring geometry, the ratio of the diameter of the plated-through hole to the width of the press-in pin and also the mechanical properties of the base materials of the press-in pin (modulus of elasticity, texture of the bronze) and also of the printed circuit board base material (primarily the resistance to compressive stress). The positively locking connection is determined by the geometry of the bearing surfaces, which are in direct contact, between the press-in pin and the metallized plated-through hole and also the topographical properties (for example roughness) of said bearing surfaces. The integrally joined connection is produced exclusively by the formation of diffusion bridges between the surface of the press-in pin and the metallized plated-through hole. Tin-based surfaces are required at least on one side for this purpose. Owing to the compressive stresses in the metallized plated-through hole, which compressive stresses are produced when folding the press-in pin, and a corresponding diffusion rate of tin on the press-in pin in relation to copper or in relation to the intermetallic copper-tin surface of the metallized plated-through hole, the two surfaces diffuse into another. A so-called gas-tight connection is already produced after a very short time. This integrally joined connection provides for a relatively high load-bearing capacity of the electromechanical connection and is used whenever non-positively locking connection- and positively locking connection-based press-in connections are inadequate for the imposed requirement. Typical tin-based surface systems are based on the non-positively locking, positively locking and integrally joined connection between the press-in pin and the metallized plated-through hole. Coatings based on tin and lead (for example SnPb5) with a sublayer of nickel are still very common but are being increasingly cut back on owing to the lead component. Thin coatings composed of extremely pure tin with a sublayer of nickel are likewise common. Novel surface systems combine tin with silver. These tin-silver layers or silver-tin layers are also applied to a sublayer composed of nickel.

Tin-free surface systems are generally based only on the non-positively locking and positively locking connection between the press-in pin and the metallized plated-through hole. Pure nickel surfaces in the form of a matt nickel layer or as a sandwich layer construction are likewise very common. In the case of the nickel sandwich layer construction, a bright nickel layer is deposited over a matt nickel layer. Nickel surfaces are often coated with friction-reducing layers, so-called lubricants, for example based on thiols or by means of perfluoropolyethers. A further known tin-free surface system is based on indium.

The surfaces, described in the prior art, of press-in pins sometimes have very critical disadvantages. On account of the high mechanical stresses, tin-based surfaces have a high tendency to grow whiskers; pure tin surfaces are affected by this in particular. However, whiskers also form on tin-lead layers, tin-silver layers or surfaces based on indium. However, considerably fewer whiskers are formed on account of the admixture of other metals. These tin whiskers can lead to short circuits. A further disadvantage of present-day press-in technology is the mechanical system itself. In order to achieve high strengths of the electromechanical connection, the pins have to introduce a correspondingly high compressive stress into the printed circuit board. This creates typical press-in technology faults, such as excessive deformation of the copper layers, the jet effect, cracks in the sleeve and also the creation of electrically conductive particles (abrasion) for example. All of these types of faults are also described in DIN-EN 60352-5, amongst others.

Therefore, in summary, either high compressive stresses in the printed circuit board with a high probability of faults and/or tin-based pin surfaces with the risk of whisker formation are required for a connection with a high mechanical load-bearing capacity between the press-in pin and the plated-through hole.

DE 103 49 584 B4 discloses a press-in pin of the generic type for an electrically conductive connection between the press-in pin and an electrically conductive bushing. The press-in pin and the bushing are configured such that a contact area which is formed between the press-in pin and the bushing is formed by plastic deformation during the press-in process. The contact area on the press-in pin and/or on the bushing is formed by an outer layer which is applied to a diffusion barrier layer and has a thickness of between 0.1 and 0.8 preferably up to 0.6 The outer layer is formed, for example, from silver, a silver alloy, gold, a gold alloy, tin or a tin alloy.

SUMMARY OF THE INVENTION

The press-in pin for an electrical contact-making arrangement according to the invention has the advantage that connections with a high load-bearing capacity between the press-in pin and the metallized plated-through hole can be formed with very low compressive stresses and also tin-free surfaces. Embodiments of the press-in pin according to the invention can have any desired design with a reactive multilayer system as the surface and can be connected to the metallized plated-through hole in the printed circuit board by means of an appropriate joining method.

Embodiments of the invention describe a connection, which is based on an integrally joined connection, with a high mechanical load-bearing capacity between the press-in pin and the metallized plated-through hole on the basis of a novel tin-free coating of the press-in pin without any of the abovementioned disadvantages of the press-in pins known from the prior art, that is to say without forming tin whiskers and without mechanical damage due to excessive input of compressive stress into the printed circuit board or the metallized plated-through hole during the joining process.

Embodiments of the present invention provide a press-in pin for an electrical contact-making arrangement, which press-in pin has an elastic press-in region and an electrically conductive coating. Here, the coating comprises a reactive multilayer which is applied to the press-in pin and a first contact layer which is applied to the reactive multilayer. This means that the surfaces of the press-in pin described in the prior art are replaced by the reactive multilayer and the first contact layer which consists of copper for example.

In addition, the invention proposes an electrical contact-making arrangement comprising a press-in pin of this kind, which has an elastic press-in region and an electrically conductive coating, and a metallized plated-through hole, which is inserted into a hole in a printed circuit board and forms a contact area for the elastic press-in region and the electrically conductive coating. The press-in pin is pushed into the metallized plated-through hole. An integrally joined connection forms between the first contact layer of the press-in pin and a second contact layer of the metallized plated-through hole, which integrally joined connection is produced on account of an exothermic reaction of the activated reactive multilayer.

Furthermore, the invention proposes a method for joining a press-in pin of this kind and a metallized plated-through hole which is inserted into a hole in a printed circuit board. The press-in pin is pushed into the metallized plated-through hole until a desired depth is reached. The reactive multilayer of the coating of the press-in pin is subsequently activated by an energy pulse which triggers an exothermic reaction of the reactive multilayer. Heat which is generated by the exothermic reaction melts the adjacent first contact layer of the press-in pin and the second contact layer of the metallized plated-through hole and welds said first contact layer and said second contact layer to one another to form an integrally joined connection. As a result, a connection with a high load-bearing capacity can be provided between the press-in pin and the metallized plated-through hole without high compressive stresses and without mechanical stress and without the risk of tin whiskers forming. Owing to the extremely short thermal input, there is advantageously no significant change in the microstructure of the metal. Owing to the subsequent exothermic reaction, the joining forces during "pressing in" of the press-in pin into the metallized plated-through hole can be considerably reduced. Therefore, it suffices to push the press-in pin only into the metallized plated-through hole. As a result, the compressive stresses in the metallized plated-through hole and in the printed circuit board can be reduced to a minimum required and all known faults of printed circuit board press-in technology can advantageously be avoided in a reliable manner. The greatly reduced joining forces provide a greater degree of freedom in terms of design when fitting the press-in pin to the leadframe. To this end, in addition to pressing the press-in pin into the metallized plated-through holes of the printed circuit board, a subsequent process for igniting the reactive multilayers has to be carried out.

It is particularly advantageous that the reactive multilayer is applied to an effective press-in length of the elastic press-in region. The reactive multilayer can be constructed, for example, from at least two different metal materials which are deposited alternately on the press-in pin in the correct phase with respect to each other. In this way, the press-in pin can be selectively coated with the reactive multilayer in the region of the effective press-in length. The two different metal materials can enter into a brief exothermic reaction in the event of appropriate activation. Since press-in pins are processed in very large numbers, the customary sputtering methods with deposition rates of between 2-6 μm/h described in the literature cannot be applied. Press-in pins are generally manufactured in stamped strips in a reel-to-reel manner and electrochemically coated by means of aqueous electrolytes in strip electroplating installations. This coating is usually performed selectively since the press-in pins very often require a different surface to the rest of the leadframe which often constitutes the contact pin or plug pin of a customer interface. Since not all metals can be deposited from aqueous electrolytes (for example aluminum) but reactive multilayer systems are often based on aluminum, the deposition of the reactive multilayer can be performed by means of special electrolytes from an aprotic solution, such as toluene for example, at elevated temperatures. To this end, a completely closed coating installation can preferably be used since the deposition takes place under an inert gas atmosphere.

In an advantageous refinement of the press-in pin, the reactive multilayer can contain aluminum as the first metal material and nickel as the second metal material. By way of example, copper can be applied as the first contact layer.

In an advantageous refinement of the electrical contact-making arrangement, dimensions and spring properties of the elastic press-in region of the press-in pin can be matched to dimensions of the metallized plated-through hole such that the elastic press-in region generates a lateral force on the metallized plated-through hole which is less than 25 N/mm². The second contact layer of the metallized plated-through hole can contain copper for example.

The press-in pin can advantageously be produced in an identical manner to present-day stamping processes. The novel feature is the dimensioning of the metallized plated-through hole in relation to the width of the press-in pin or to the spring characteristic of said press-in pin. Whereas very high mechanical stresses (generally >>150 MPa (150 N/mm²)) are required between the press-in pin and the metallized plated-through hole in conventional press-in technology, the metallized plated-through hole of the printed circuit board for executing the method according to the invention for joining a press-in pin according to the invention to a reactive multilayer and the metallized plated-through hole can now be dimensioned such that the press-in pin only introduces low mechanical stresses (<20 N/mm² (20 MPa)) into the metallized plated-through hole. All of the disadvantages (deformations, jet effect, cracks, chips etc.) described in the prior art when joining the press-in pin and the metallized plated-through hole therefore advantageously no longer exist. After the comparatively straightforward pressing or pushing of the press-in pin into the appropriate metallized plated-through hole of the printed circuit board, the reactive multilayers have to be brought into exothermic reaction. An "ignition pulse" is required for this purpose. Said ignition pulse can be generated, for example, as an electrical pulse or with a laser as a laser pulse. Since a tip of the press-in pin protrudes out of the printed circuit board after the press-in process, the exothermic chemical reaction can be easily started by means of a laser pulse targeted at the pin tip. As an alternative, the exothermic chemical reaction can be started by means of a targeted electrical pulse which is introduced into the tip of the press-in pin via a probe needle. As a result, energy is released in the form of heat which activates the adjoining regions next to the "ignition point". A thermal wave is created through the entire reactive multilayer of the press-in pin. The exothermically generated heat is enough to melt other metals which are in direct contact. As a result, welding of the metallized plated-through hole to the press-in pin is realized without a significant thermal input into the printed circuit board since the reaction proceeds extremely quickly. Therefore, a so-called gas-tight connection with a high load-bearing capacity is established between the press-in pin and the metallized plated-through hole. Since the metallized plated-through holes of printed circuit board bores are generally based on copper, a thin copper plating of the press-in pin above the reactive multilayer would be suitable. This thin copper layer as the first contact layer fuses with the copper layer as the second contact layer of the metallized plated-through hole. Copper has a melting point of 1085° C. Multilayers based on alternating nickel-aluminum layers have an adiabatic reaction temperature of 1639° C., that is to say considerably above said melting point of copper. In the new state, the copper layers can additionally be well passivated with wafer-thin organic coatings and protected against oxidation. Both passivations provide damping at high temperatures and do not adversely affect the copper fusing between the press-in pin and the metallized plated-through hole. There is a reduction in the costs of producing the printed circuit board plate since the chemical tin-plating which is customary at present can be dispensed with owing to the changeover to organic coatings of the second contact layer of the metallized plated-through hole.

Exemplary embodiments of the invention are illustrated in the drawing and will be explained in greater detail in the following description. In the drawing, identical reference symbols denote components or elements which execute the same or similar functions.

DETAILED DESCRIPTION

Figure 1:
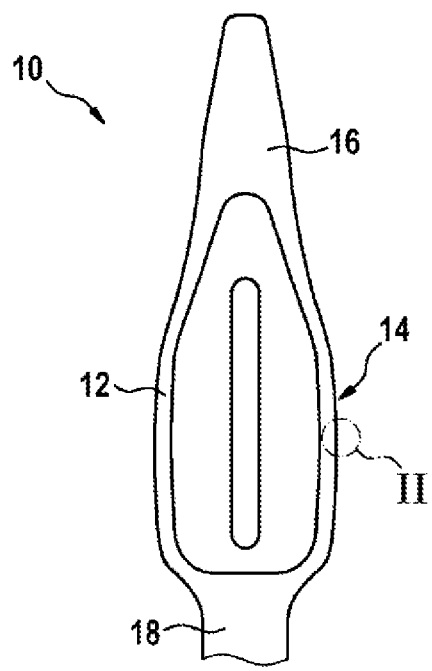
FIG. 1 shows a schematic sectional illustration of an exemplary embodiment of a press-in pin according to the invention for an electrical contact-making arrangement.
Figure 2:
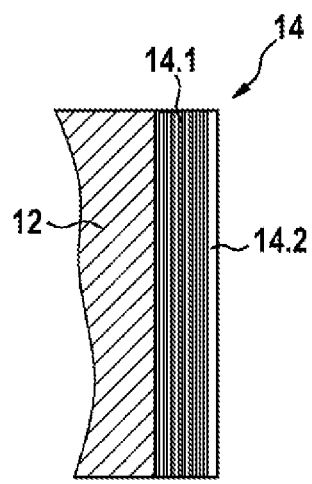
FIG. 2 shows an illustration of a detail II from FIG. 1.

As is shown in FIG. 1, the illustrated exemplary embodiment of a press-in pin 10 according to the invention for an electrical contact-making arrangement 1 comprises an elastic press-in region 12 and an electrically conductive coating 14. Here, the coating 14 comprises a reactive multilayer 14.1 which is applied to the press-in pin 10 and a first contact layer 14.2 which is applied to the reactive multilayer 14.1.

In the illustrated exemplary embodiment of the press-in pin 10, the reactive multilayer 14.1 is applied to an effective press-in length of the elastic press-in region 12. In the illustrated exemplary embodiment, the reactive multilayer 14.1 contains aluminum as the first metal material and nickel as the second metal material. The reactive multilayer 14.1, which is formed as a nickel-aluminum layer stack, has a releasing bond enthalpy of −59 kJ/mol and generates an adiabatic reaction temperature of 1639° C. It goes without saying that the reactive multilayer 14.1 can also be constructed from at least two other different metal materials which are deposited on the press-in pin 10 in an alternating manner in the correct phase in relation to one another. In the illustrated exemplary embodiment, the first contact layer 14.2 of the press-in pin 10 consists of copper. The elastic press-in region 12 is arranged between a tip 16 and a contact pin 18 or plug pin of the press-in pin.

As is further shown in FIGS. 3 to 6, the illustrated exemplary embodiment of an electrical contact-making arrangement 1 according to the invention comprises the press-in pin 10, which has the elastic press-in region 12 and the electrically conductive coating 14, and comprises a metallized plated-through hole 7, which is inserted into a hole 5 in a printed circuit board 3 and forms a contact area 8 for the elastic press-in region 12 and the electrically conductive coating 14. The press-in pin 10 is pushed into the metallized plated-through hole 7. An integrally joined connection 9 is formed between the first contact layer 14.2 of the press-in pin 10 and a second contact layer 8.1 of the metallized plated-through hole 7, which integrally joined connection is produced on account of an exothermic reaction of the activated reactive multilayer 14.1.

Figure 3:
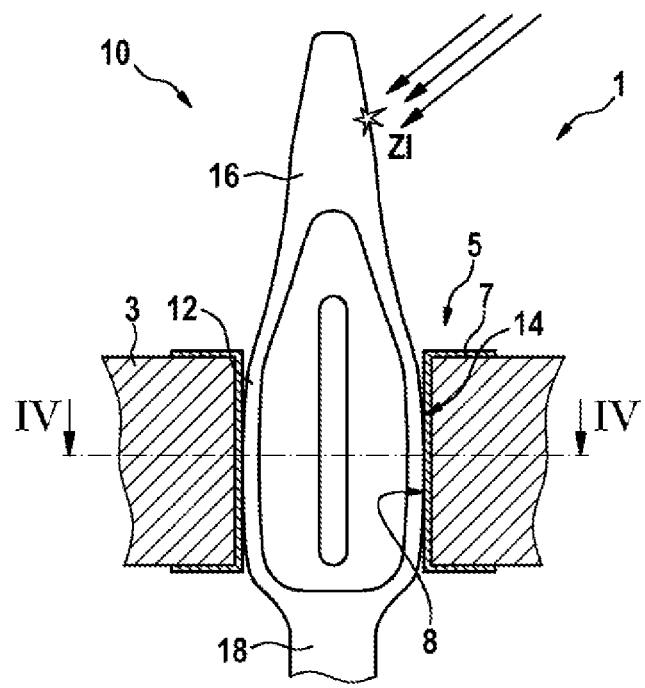
FIG. 3 shows a schematic sectional illustration of an exemplary embodiment of an electrical contact-making arrangement according to the invention comprising the press-in pin from FIG. 1.
Figure 4:
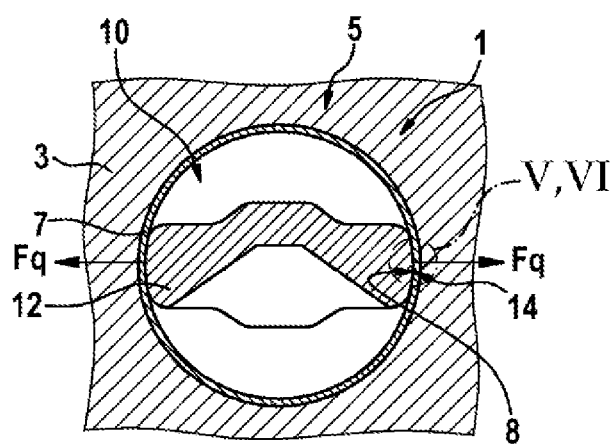
FIG. 4 shows a sectional illustration along section line IV-IV from FIG. 2.
Figure 5:
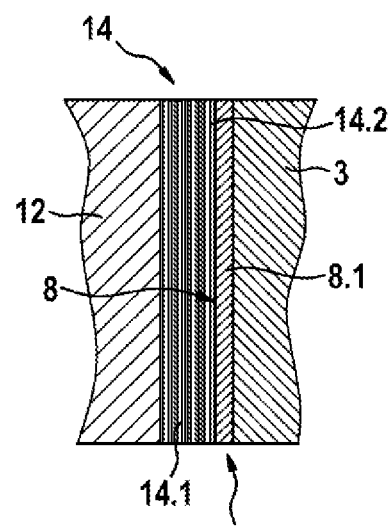
FIG. 5 shows an illustration of a detail V from FIG. 4 before the activation of a reactive multilayer of the press-in pin.

As is further shown in FIGS. 3, 4 and 5, the press-in pin 10, at its flanks, bears against the metallized plated-through hole 7 and the thin copper plating of the press-in pin 10 as the first contact layer 14.2 is in direct contact with the copper of the second contact layer 8.1 of the metallized plated-through hole 7. In the illustration according to FIG. 5, no reaction has taken place through the reactive multilayer 14.1 as yet. As is further shown in FIG. 4, the press-in pin 10 is hardly deformed during joining since, in contrast to conventional pressing in, only a small amount of surface-area pressing is required. Therefore, dimensions (width) and spring properties of the elastic press-in region 12 of the press-in pin 10 are matched to dimensions (diameter) of the metallized plated-through hole 7 such that the elastic press-in region 12 generates a lateral force Fq on the metallized plated-through hole 7 which is less than 25 N/mm$^2$.

Figure 6:
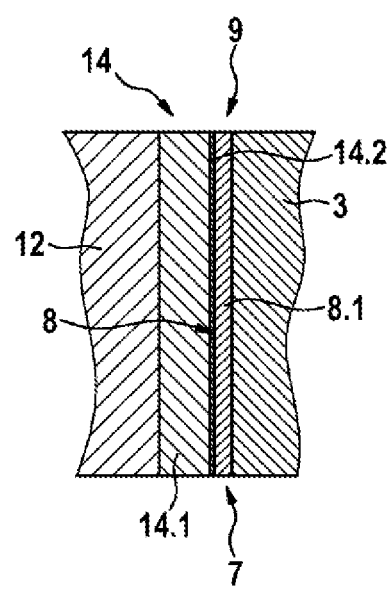
FIG. 6 shows an illustration of a detail VI from FIG. 4 after the activation of the reactive multilayer of the press-in pin.

In order to carry out the method for joining the press-in pin 10 and the metallized plated-through hole 7, the press-in pin 10 is pushed into the metallized plated-through hole 7 until a desired depth is reached. The reactive multilayer 14.1 of the coating 14 of the press-in pin 10 is then activated by an energy pulse which triggers an exothermic reaction of the reactive multilayer 14.1. Heat which is generated by the exothermic reaction melts the adjacent first contact layer 14.2 of the press-in pin 10 and the second contact layer 8.1 of the metallized plated-through hole 7 and welds the first contact layer 14.2 to the second contact layer 8.1 to form the integrally joined connection 9, as is shown in FIG. 6. This means that the exothermic reaction of the reactive multilayer 14.1 is started by the energy pulse. At the contact area 8 between the press-in pin 10 and the metallized plated-through hole 7, the two copper layers which lie against one another, that is to say the first contact layer 14.2 and the second contact layer 8.1, are welded to form the gas-tight integrally joined connection 9. In the illustrated exemplary embodiment, the energy pulse is generated as a laser pulse ZI by a laser. As an alternative, the energy pulse can be generated as an electrical pulse which is introduced into the tip 16 of the press-in pin 10 via a probe needle.

As is further shown in FIG. 3, the laser pulse ZI is introduced in a targeted manner into a tip 16 of the press-in pin 10 which is pushed into the metallized plated-through hole 7 and protrudes out of the metallized plated-through hole 7. As a result, energy is released in the form of heat which activates the adjoining regions next to the "ignition point". A thermal wave is created through the press-in pin 10 and the entire reactive multilayer 14.1 of the coating 14 of the press-in pin 10. The exothermically generated heat is enough to melt other metals which are in direct contact. As a result, welding of the metallized plated-through hole 7 to the press-in pin 10 is realized without a significant thermal input into the printed circuit board 3 since the reaction proceeds extremely quickly. Therefore, the so-called gas-tight connection 9 with a high load-bearing capacity is established between the press-in pin 10 and the metallized plated-through hole 7.

Since press-in pins 10 are processed in very large numbers, embodiments of the press-in pin according to the invention are produced in stamped strips in a reel-to-reel manner. Here, the contact pins 18 of the press-in pin 10 are selectively electrochemically coated by means of aqueous electrolytes in a first strip electroplating installation. The reactive multilayers 14.1 on the elastic regions 12 of the press-in pin 10 are deposited, for example, in a second completely closed coating installation by means of special electrolytes from an aprotic solution, such as toluene for example, at elevated temperatures since aluminum as part of the reactive multilayer 14.1 of the illustrated press-in pin 10 according to the invention cannot be deposited from aqueous electrolytes.

What is claimed is:

1. A press-in pin (10) for an electrical contact-making arrangement (1), the press-in pin comprising an elastic press-in region (12) and an electrically conductive coating (14),
   characterized in that the electrically conductive coating (14) comprises a reactive multilayer (14.1) and a first contact layer (14.2), wherein the reactive multilayer (14.1) is applied to the elastic press-in region (12) and the first contact layer (14.2) is applied to the reactive multilayer (14.1), and wherein the reactive multilayer (14.1) is configured to be activated by an energy pulse which triggers an exothermic reaction of the reactive multilayer such that heat generated by the exothermic reaction melts the first contact layer (14.2).

2. The press-in pin (10) as claimed in claim 1, characterized in that the reactive multilayer (14.1) is applied to an effective press-in length of the elastic press-in region (12).

3. The press-in pin (10) as claimed in claim 1, characterized in that the reactive multilayer (14.1) is constructed from at least two different metal materials which are deposited alternately on the press-in pin (10).

4. The press-in pin (10) as claimed in claim 1, characterized in that the reactive multilayer (14.1) contains aluminum as a first metal material and nickel as a second metal material.

5. The press-in pin (10) as claimed in claim 1, characterized in that copper is applied as the first contact layer (14.2).

6. The press-in pin (10) as claimed in claim 1, characterized in that the reactive multilayer (14.1) is tin-free.

7. An electrical contact-making arrangement (1) comprising
   a press-in pin (10), which has an elastic press-in region (12) and an electrically conductive coating (14), and
   a metallized plated-through hole (7), which is inserted into a hole (5) in a printed circuit board (3) and forms a contact area (8) for the elastic press-in region (12) and the electrically conductive coating (14),
   wherein the press-in pin (10) is pushed into the metallized plated-through hole (7) and forms an integrally joined connection (9) between a first contact layer (14.2) of the press-in pin (10) and a second contact layer (8.1) of the metallized plated-through hole (7),
   wherein the coating (14) comprises a reactive multilayer (14.1) which is applied to the elastic press-in region (12) and a first contact layer (14.2) which is applied to the reactive multilayer (14.1), and
   wherein the integrally joined connection (9) is produced by an exothermic reaction of the activated reactive multilayer (14.1).

8. The electrical contact-making arrangement (1) as claimed in claim 7, characterized in that dimensions and spring properties of the elastic press-in region (12) of the press-in pin (10) are matched to dimensions of the metallized plated-through hole (7) such that the elastic press-in region (12) generates a lateral force (Fq) on the metallized plated-through hole (7) which is less than 25 N/mm$^2$.

9. The electrical contact-making arrangement (1) as claimed in claim 7, characterized in that the second contact layer (8.1) of the metallized plated-through hole (7) contains copper.

10. The electrical contact-making arrangement (1) as claimed in claim 7, characterized in that the reactive multilayer (14.1) is tin-free.

11. A method for joining a press-in pin (10) with a metallized plated-through hole (7), the press-in pin comprising an elastic press-in region (12) and an electrically conductive coating (14),
    characterized in that the coating (14) comprises a reactive multilayer (14.1) which is applied to the elastic press-in region (12) and a first contact layer (14.2) which is applied to the reactive multilayer (14.1),
    the method comprising:
    inserting the metallized plated-through hole (7) into a hole (5) in a printed circuit board (3) to form a contact area (8) for the elastic press-in region (12) and the electrically conductive coating (14),
    pushing the press-in pin (10) into the metallized plated-through hole (7) until a desired depth is reached, and
    activating the reactive multilayer (14.1) of the coating (14) of the press-in pin (10) by an energy pulse which triggers an exothermic reaction of the reactive multilayer (14.1),
    wherein heat which is generated by the exothermic reaction melts the adjacent first contact layer (14.2) of the press-in pin (10) and the second contact layer (8.1) of the metallized plated-through hole (7) and welds said first contact layer and said second contact layer to one another to form an integrally joined connection (9).

12. The method as claimed in claim 11, characterized in that the energy pulse is introduced in a targeted manner into a tip (16) of the press-in pin (10) which is pushed into the metallized plated-through hole (7), said pin protruding out of the metallized plated-through hole (7).

13. The method as claimed in claim 11, characterized in that the energy pulse is generated as a laser pulse (ZI) or an electrical pulse.

14. The method as claimed in claim 11, characterized in that the reactive multilayer (14.1) is tin-free.

* * * * *